US012567866B2

(12) United States Patent
Sharma et al.

(10) Patent No.: US 12,567,866 B2
(45) Date of Patent: Mar. 3, 2026

(54) DIGITAL TO ANALOG CONVERTER USING HIGH-INJECTION VELOCITY CHANNEL MATERIALS FOR LOW TEMPERATURE SIGNAL CONVERSION

(71) Applicant: Intel Corporation, Santa Clara, CA (US)

(72) Inventors: Abhishek Sharma, Portland, OR (US); Wilfred Gomes, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 747 days.

(21) Appl. No.: 17/712,047

(22) Filed: Apr. 1, 2022

(65) Prior Publication Data

US 2023/0318611 A1     Oct. 5, 2023

(51) Int. Cl.
H03M 1/06 (2006.01)
H03M 1/08 (2006.01)
H10B 63/00 (2023.01)

(52) U.S. Cl.
CPC ......... H03M 1/0617 (2013.01); H03M 1/089 (2013.01); H10B 63/34 (2023.02)

(58) Field of Classification Search
CPC ........ H03M 1/74; H03M 1/742; H03M 1/089; H03M 1/0617; H01B 63/30; H01B 63/34
See application file for complete search history.

(56) References Cited

U.S. PATENT DOCUMENTS

| | | | | |
|---|---|---|---|---|
| 7,150,823 B2 * | 12/2006 | Mayer | ..................... | C10G 2/32 |
| | | | | 208/252 |
| 7,232,935 B2 * | 6/2007 | Jakkula | ................... | C10G 3/50 |
| | | | | 208/179 |
| 8,581,760 B2 * | 11/2013 | Muhammad | .......... | H03M 1/201 |
| | | | | 374/3 |
| 8,786,478 B1 * | 7/2014 | Choi | ................... | H03M 1/0863 |
| | | | | 341/120 |
| 9,148,160 B2 * | 9/2015 | Zhu | ........................ | H04B 15/02 |
| 9,337,854 B1 * | 5/2016 | Chen | .................. | H03M 1/0673 |
| 9,705,000 B2 * | 7/2017 | Glass | ............... | H01L 21/76886 |
| 10,291,246 B2 * | 5/2019 | Chandra | ............. | H03M 1/0607 |
| 10,515,981 B2 * | 12/2019 | Or-Bach | ................ | B82Y 10/00 |
| 10,950,722 B2 * | 3/2021 | Zhang | .................... | H10D 30/63 |
| 12,100,658 B2 * | 9/2024 | Or-Bach | ............... | H10B 43/35 |
| 12,178,055 B2 * | 12/2024 | Or-Bach | ............... | H10B 80/00 |
| 12,250,830 B2 * | 3/2025 | Or-Bach | ................ | H01L 24/08 |
| 2003/0128142 A1 * | 7/2003 | Khalil | ................... | H03M 1/662 |
| | | | | 341/144 |
| 2004/0010682 A1 * | 1/2004 | Foster | .................... | H04L 63/10 |
| | | | | 713/156 |
| 2009/0237285 A1 * | 9/2009 | Schemmann | ....... | H03M 1/0614 |
| | | | | 341/144 |

(Continued)

*Primary Examiner* — Lam T Mai

(74) *Attorney, Agent, or Firm* — Essential Patents Group, LLP

(57) ABSTRACT

Integrated circuit dies, systems, and techniques are described related to multiple gate digital to analog converters operable at low temperatures. A multiple gate digital to analog converter includes a channel material spanning a length between a source and a drain and multiple gate structures of different sizes coupled to the channel material and spaced apart along the length. The multiple gate structures of the digital to analog converter are independently operable to convert a digital input to an analog output.

22 Claims, 11 Drawing Sheets

(56) References Cited

U.S. PATENT DOCUMENTS

| | | | |
|---|---|---|---|
| 2011/0269288 A1* | 11/2011 | Hu | H10D 30/0212 |
| | | | 257/E21.409 |
| 2015/0200681 A1* | 7/2015 | Duggal | H03M 1/1038 |
| | | | 341/120 |
| 2015/0341045 A1* | 11/2015 | Gomez | H03M 1/742 |
| | | | 341/144 |
| 2016/0329431 A1* | 11/2016 | Glass | H10D 30/6219 |
| 2023/0197812 A1* | 6/2023 | Murthy | H10D 62/405 |
| | | | 257/467 |

* cited by examiner

700

103

102

116

M8

V7

143
144

M7

V6

M6

V5

104

M5

V4

V3    M4

M3

V2    V2

M2    M2    310

V1    V1    150

M1    M1

V0    V0

TCN 112  105    113    122    123    121

107    114  106    108    100

101    134    142

Z
Y    X

DIGITAL TO ANALOG CONVERTER USING HIGH-INJECTION VELOCITY CHANNEL MATERIALS FOR LOW TEMPERATURE SIGNAL CONVERSION

BACKGROUND

In electronics systems, digital to analog converters (DACs) convert digital signals to analog signals. For example, DACs may convert finite precision numbers such as fixed point binary numbers to a physical quantity such as current or voltage. DACs have a wide range of applications in fields inclusive of audio, video, telecommunications, and many others. There is an ongoing need for improved DACs to enable ever increasing demand for more complex systems, reduced computation times, and other considerations. Currently, DACs may be deployed in a variety of architectures inclusive of multiple transistor and resistor systems such as binary-weighted-input DAC circuits. However, such systems have limitations due, in particular, to being very dissipative, requiring large areas for implementation, and using large amounts of power in deployment.

It is with respect to these and other considerations that the present improvements have been needed. Such improvements may become critical as the desire to improve computational efficiency become even more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
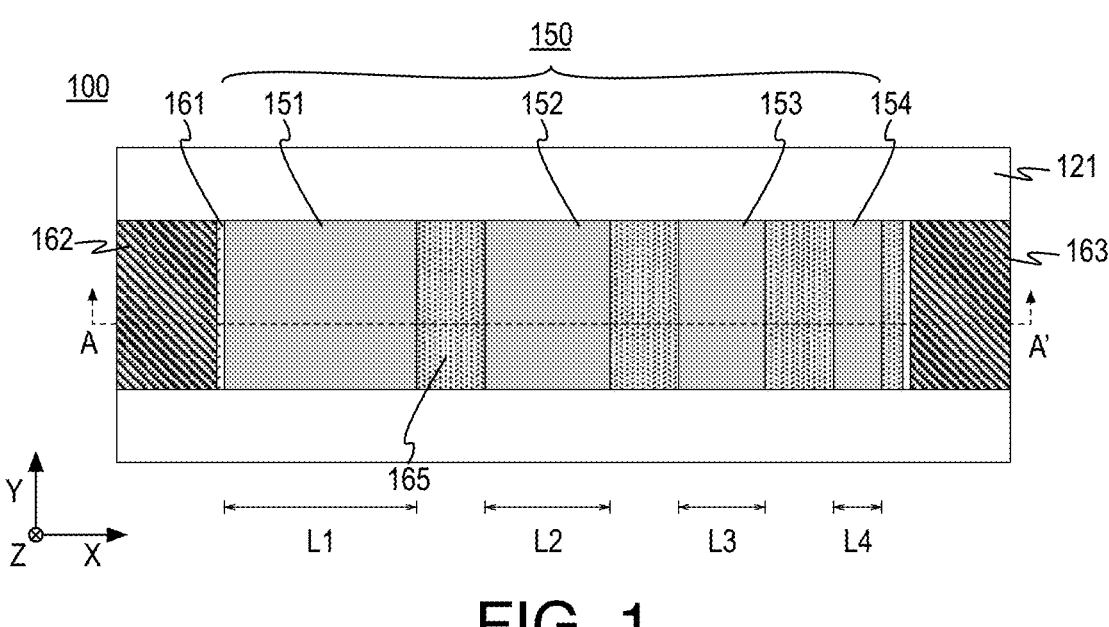
FIG. 1 illustrates a top-down view of a multi-sized multiple gate digital to analog converter.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. As used herein, the terms "monolithic", "monolithically integrated", and similar terms indicate the components of the monolithic overall structure form an indivisible whole not reasonably capable of being separated.

Integrated circuit structures, integrated circuit dies, systems, and techniques are described herein related to digital to analog converters having multiple independent gates coupled to a high-injection velocity channel materials for low temperature signal conversion.

As discussed, digital to analog converters (DACs) are an important component in a variety of systems and compute environments. Furthermore, typical computational systems are deployed within a temperature range inclusive of room temperature (e.g., about 20 to 25° C.). However, there is a growing desire to deploy computational systems at very low temperatures. In some embodiments, an apparatus or device includes an integrated circuit (IC) die having a digital to analog converter including a channel material spanning a length between a source and a drain. That is, the channel material extends between the source and drain such that it terminates near each of the source and drain and may be in direct contact with each of the source and drain. The digital to analog converter further includes a plurality of gate structures (i.e., two or more gate structures) spaced apart along the length of the channel material between the source and the drain such that adjacent ones of the gate structures are separated by dielectric material and such that each of the gate structures is coupled to a separate control line. Notably, each of the gate structures are separately controllable such that a particular bit of a digital input may be separately applied to each gate structure. A voltage bias is then applied across the channel material and the resultant current is output as an analog signal associated with the digital input, as discussed further herein.

Notably, the discussed gate structures may be multi-sized such that the gate structures have multiple lengths along the channel material (e.g., in a dimension running from source to drain) such that the inputs to each of the gate structures may be differentiated on the output. The larger gate structures have a greater impact on controlling the channel material (e.g., inverting the channel material) and the greater the amount of channel material that is under control, the greater the current output. For example, a greatest current output is associated with all gate structures being biased and a least current output is associated with the smallest gate structure being biased. This smallest gate structure may represent the least significant bit (LSB) of the digital input. A most significant bit (MSB) may be then be associated with a largest gate structure, and bits between the MSB and LSB may be associated with gate structures of decreasing sizes. Thereby, each bit may be associated with a differing output when only that bit is activated and it may contribute to a differing output when various combinations of the bits are activated.

The structures and techniques discussed herein provide a DAC using multi-sized, independently operable gates between source and drain terminals. The source and drain may be a single terminal (as depicted herein) or multiple terminal sources and drains may be deployed. Similarly, the channel material may be a single channel material (as depicted herein) or multiple strips of channel material (with single or multiple source/drain) may be used. In any event, each independent gate structure is a single controllable entity of several multi-sized gate structures between the source(s) and drain(s). Such multi-sized gate structures modulate conductance between the source and drain with the largest gate structure corresponding to the MSB and controlling largest area of the channel material and the smallest gate structure corresponding to the LSB and controlling smallest area of the channel material. It is noted that such MSB/largest gate structure and LSB/smallest gate structure configuration may be switched as is known in the art.

In some embodiments, an IC die including the DAC is advantageously deployed in a very low temperature environment. At such very low temperatures, the DACs have very low series resistance in the channel material (and between the regions activated by the gate structures). For example, the gate structures are separated by dielectric material and the channel materials, when activated, include inactivated (e.g., non-inverted regions) both at regions of the channel material under the dielectric material and at regions that are inactive due to not being under activated gate structures (e.g., gates that are 0 bit). At very low temperatures, the resistance due to such inactive regions and the boundaries with active regions are limited, and the current signal is less impeded than at room temperature such that detectable analog output signals are detectable. Furthermore, the channel materials deploy high injection velocity channel materials, which provide sufficient current particularly at the discussed boundaries between active regions. As used herein, the term injection velocity indicates the velocity of electrons (e.g., in a ballistic model) at the entry (e.g., 0 to 10 nm) into the material. Exemplary high injection velocity materials are described further herein. Such high injection velocity channel materials and/or deployment in very low temperature contexts enable the DAC circuit functionality using the multi-sized independent gate structures discussed herein.

The discussed multi-sized independent gate DAC devices discussed herein may be implemented in any suitable architecture such as a planar architecture (as depicted herein) or non-planar architectures. As used herein, a planar architecture indicates a DAC having a single plane interface between the gate structures and channel material thereof. The term non-planar architecture indicates a DAC having more than a single plane interface between the gate structures and channel material. Such non-planar architectures may also be characterized as multi-gate devices. For example, Fin based architectures, where the gate is on two, three, or four sides of a fin of channel material may be used. In some embodiments, the non-planar devices use a gate all around architecture where the gate surrounds one or more channel materials on all sides.

As discussed, the IC die including multi-sized independent gate DAC devices is deployed in a very low temperature context. In some embodiments, the operating temperature of the IC die is maintained at or below 0° C. In some embodiments, the operating temperature of the IC die is maintained at or below about −196° C. (i.e., using liquid nitrogen as the coolant). In some embodiments, the operating temperature of the IC die is maintained at or below about −25° C. In some embodiments, the operating temperature of the IC die is maintained at or below about −50° C. In some embodiments, the operating temperature of the IC die is maintained at or below about −70° C. In some embodiments, the IC die is maintained at or below about −100° C.

FIG. 1 illustrates a top-down view of a multi-sized multiple gate digital to analog converter 100, arranged in accordance with at least some implementations of the present disclosure. In FIG. 1, a top-down view (i.e., into the x-y plane) is provided with a dielectric material 164 removed for the sake of clarity of presentation. As shown, multi-sized multiple gate digital to analog converter 100 (DAC 100) includes a source 162, a drain 163, and multiple gate structures 150 inclusive of gate structures 151, 152, 153, 154 between source 162 and drain 163. For example, DAC 100 is characterized as a multi-sized multiple gate DAC as it includes multiple gate structures 150 having differing or multiple sizes as shown with respect to along-a-channel lengths L1, L2, L3, L4. As used herein, the term length along a channel or similar terms indicate a length extending between source 162 and drain 163 and along a length of channel material. For example, lengths L1, L2, L3, L4 are along the x-dimension with L1>L2>L3>L4.

Figure 2:
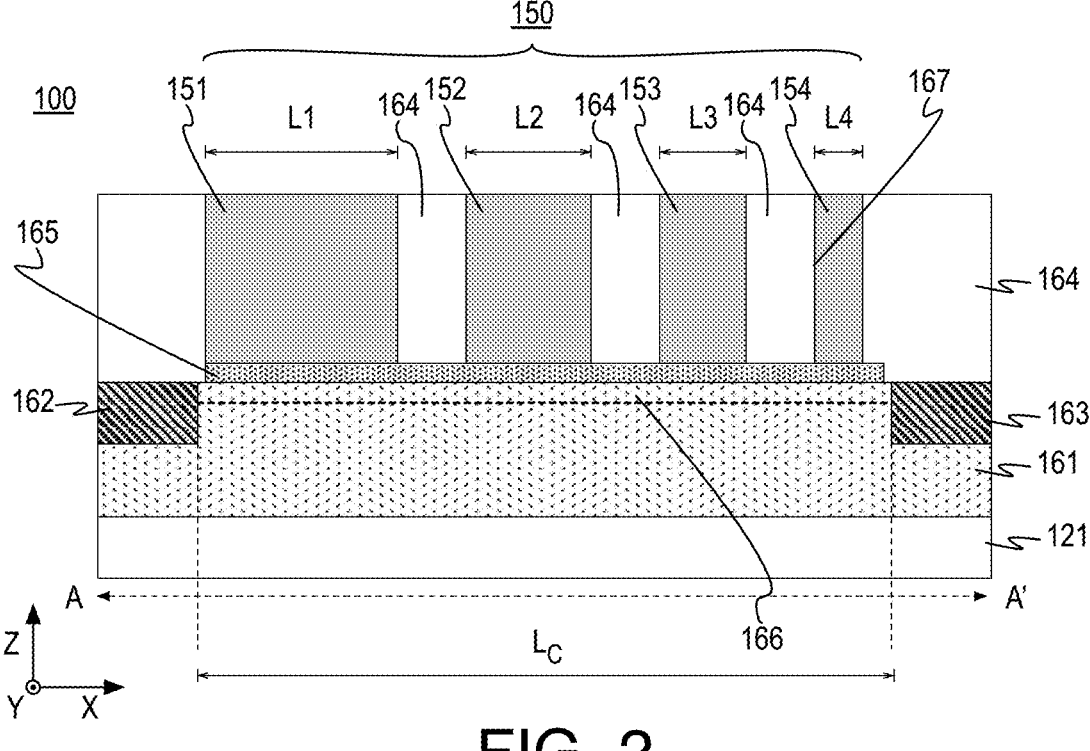
FIG. 2 illustrates a cross-sectional view of the multi-sized multiple gate digital to analog converter of FIG. 1.

FIG. 2 illustrates a cross-sectional view of multi-sized multiple gate digital to analog converter 100, arranged in accordance with at least some implementations of the present disclosure. In FIG. 2, an along the channel view is provided into the A-A' plane (i.e., a plane bisecting source 162, drain 163, and gate structures 151, 152, 153, 154) depicted in FIG. 1. For example, DAC 100 may be deployed by an IC system that includes a lateral surface along the x-y plane that may be defined or taken at any vertical position of the IC system. The lateral surface of the x-y plane is orthogonal to a vertical or build up dimension as defined by the z-axis.

DAC 100 may be formed on and/or in any substrate 121 (e.g., substrate material) suitable for the fabrication of semiconductor device circuitry. In some embodiments, substrate 121 is used to manufacture DAC 100 and other components of an IC system. Semiconductor substrate may include a wafer or other piece of silicon or another semiconductor material. Suitable semiconductor substrates include, but are not limited to, single crystal silicon, poly crystalline silicon and silicon on insulator (SOI), as well as similar substrates formed of other semiconductor materials, such as gallium arsenide. Substrate 121 may also include semiconductor materials, metals, dielectrics, dopants, and other materials commonly found in semiconductor substrates. For example, substrate 121 may be a substrate substantially aligned along a predetermined crystal orientation (e.g., (100), (111), (110), or the like). In some examples, substrate 121 may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. In some examples, substrate 121 may include silicon having a (100) crystal orientation with a 4°-11° miscut (with 4°-6° being particularly advantageous). Examples using silicon having a crystal orientation of (110) or (111) may offer the advantage of having a smaller mismatch for subsequent epitaxial growth. For example, substrate 121 may be (111) silicon, (100) silicon, or (110) silicon. In an embodiment, substrate 121 includes a (111) crystalline group IV material. In some embodiments, substrate 121 is the same or similar material with respect to a channel material 161.

Channel material 161 spans a length $L_C$ between source 162 and drain 163. In some embodiments, channel material 161 is in contact with both source 162 and drain 163. During operation, portions of layer 166 of channel material 161 are inverted by one or more of gate structures 150 such that, depending on the number of gate structures 150 and which gate structures 150 are activated (e.g., a voltage is applied thereto), a differing current flows from source 162 to drain 163. Details of such operation are discussed further herein below.

Channel material 161 may include any suitable semiconductor material inclusive of high injection velocity materials. For example, channel material 161 may be one of a narrow band gap material or a highly doped material. As used herein, the term narrow band gap material indicates semiconductor material having a band gap of not more than 0.8 eV. At very low temperatures, narrow band gap materials have very low series resistance and can advantageously be deployed in DAC 100. The narrow band gap material deployed in channel material 161 of DAC 100 may be any suitable narrow band gap semiconductor. In some embodiments, channel material 161 is a crystalline material. As used herein, the term crystalline indicates a material of constituents arranged in a highly ordered structure. A crystalline material may be monocrystalline, though it need not be. Furthermore, as used herein, the one or more atoms listed after the term crystalline indicate atoms that are part of the crystal lattice of the crystalline material, though other dopant materials may also be part of the crystalline material. Therefore, the term crystalline indium and arsenic, for example, indicates the material includes one or more crystals of indium and arsenic (i.e., indium arsenide), which optionally includes dopant materials.

In some embodiments, channel material 161 is a crystalline material including one of indium arsenide, indium antimonide, gallium antimonide, indium gallium arsenide, oxides of these materials, sulphides of these materials, or selenides of these materials. In some embodiments, channel material 161 includes crystalline indium and arsenic (e.g., channel material 161 is indium arsenide such as crystalline indium arsenide). In some embodiments, channel material 161 includes crystalline indium, arsenic, and oxygen (e.g., channel material 161 is an oxide of indium arsenide). In some embodiments, channel material 161 includes crystalline indium, arsenic, and sulfur (e.g., channel material 161 is a sulphide of indium arsenide). In some embodiments, channel material 161 includes crystalline indium, arsenic, and selenium (e.g., channel material 161 is a selenide of indium arsenide).

In some embodiments, channel material 161 includes crystalline indium and antimony (e.g., channel material 161 is indium antimonide such as crystalline indium antimonide). In some embodiments, channel material 161 includes crystalline indium, antimony, and oxygen (e.g., channel material 161 is an oxide of indium antimonide). In some embodiments, channel material 161 includes crystalline indium, antimony, and sulfur (e.g., channel material 161 is a sulphide of indium antimonide). In some embodiments, channel material 161 includes crystalline indium, antimony, and selenium (e.g., channel material 161 is a selenide of indium antimonide).

In some embodiments, channel material 161 includes crystalline gallium and antimony (e.g., channel material 161 is gallium antimonide such as crystalline gallium antimonide). In some embodiments, channel material 161 includes crystalline gallium, antimony, and oxygen (e.g., channel material 161 is an oxide of gallium antimonide). In some embodiments, channel material 161 includes crystalline gallium, antimony, and sulfur (e.g., channel material 161 is a sulphide of gallium antimonide). In some embodiments, channel material 161 includes crystalline gallium, antimony, and selenium (e.g., channel material 161 is a selenide of gallium antimonide).

In some embodiments, channel material 161 includes crystalline indium, gallium, and arsenic (e.g., channel material 161 is indium gallium arsenide such as crystalline indium gallium arsenide). In some embodiments, channel material 161 includes crystalline indium, gallium, arsenic, and oxygen (e.g., channel material 161 is an oxide of indium gallium arsenide). In some embodiments, channel material 161 includes crystalline indium, gallium, arsenic, and sulfur (e.g., channel material 161 is a sulphide of indium gallium arsenide). In some embodiments, channel material 161 includes crystalline indium, gallium, arsenic, and selenium (e.g., channel material 161 is a selenide of indium gallium arsenide).

In some embodiments, channel material 161 includes crystalline germanium (e.g., channel material 161 is germanium such as crystalline germanium). In some embodiments, channel material 161 includes crystalline silicon and germanium (e.g., channel material 161 is silicon germanium such as crystalline silicon germanium) with not less than 75% germanium by atomic percentage. Herein, material percentages are given in atomic percentage unless otherwise indicated.

As discussed, in some embodiments, channel material 161 is a highly doped material. As used herein, the term highly doped or ultra high dopant material indicates a material having a dopant concentration of not less than 1e16/cm3 of the dopant material(s). In some embodiments, channel material 161 is one of crystalline silicon and germanium (SiGe), crystalline germanium Ge, crystalline indium and arsenic (InAs), crystalline indium and phosphorous (InP), crystalline indium, gallium, zinc, and oxygen (IGZO), crystalline indium, gallium, and arsenic (InGaAs), crystalline molybdenum and sulfur ($MoS_2$), or crystalline tungsten and selenium ($WSe_2$) doped with a dopant material at a concentration between 1e16/cm3 to 1e22/cm3. The dopant material may be any suitable dopant such as aluminum (Al), boron (B), oxygen vacancies, or hydrogen (H).

As discussed, channel material 161 spans a length $L_C$ between source 162 and drain 163. The length $L_C$ between source 162 and drain 163 may be defined or characterized as a channel length and may be any suitable length such as a length in the range of 50 to 500 nm. In some embodiments, length $L_C$ is not less than 50 nm. In some embodiments, length $L_C$ is not less than 150 nm. In some embodiments, length $L_C$ is in the range of 200 to 500 nm. Other channel lengths may be used. In some embodiments, L4 is in the range of 5 to 50 nm. In some embodiments, L4 is not more than 50 nm. In some embodiments, L4 is not more than 25 nm. The other lengths, L1, L2, L3 may be determined from length L4 using the length ratios discussed herein.

DAC 100 may deploy n-type MOS (NMOS) materials or p-type MOS (PMOS) materials. As used herein, an NMOS DAC is a DAC with n-type source and drain materials. For example, source 162 and drain 163 may be an intrinsic semiconductor material doped with an n-type dopant such as phosphorous, arsenic, or antimony. Such NMOS DACs may be inversion type such that channel material 161 is p-type and, during operation, an inversion layer is formed in the channel to allow conduction of electrons through the channel A PMOS DAC is a DAC with p-type source and drain materials. For example, source 162 and drain 163 may be an intrinsic semiconductor material optionally doped with a p-type dopant such as boron or gallium. Such PMOS DACs may again be inversion type such that the channel semiconductor is n-type and, during operation, an inversion layer is formed in the channel to allow conduction of holes through the channel. The semiconductor deployed in source 162 and drain 163 may be any suitable material such as silicon, silicon and germanium, or others.

In some embodiments, gate structures 150 are separated from channel material 161 by a gate dielectric layer 165. Gate dielectric layer 165 may include one layer or a stack of layers. The one or more layers of gate dielectric layer 165 may include silicon oxide, silicon dioxide ($SiO_2$), and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in gate dielectric layer 165 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Gate structures 150 (e.g., gate electrodes) are on gate dielectric layer 165 and may include of at least one of a p-type work function metal or an n-type work function metal, depending on whether the DAC is PMOS or NMOS.

In some embodiments, gate structures 150 are each a stack of two or more metal layers, where one or more metal layers are work function metal layers and at least one metal layer is a fill metal layer. For a PMOS transistor, metals that may be used for the gate electrode include, but are not limited to, ruthenium, palladium, platinum, cobalt, nickel, and conductive metal oxides, e.g., ruthenium oxide. A p-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An n-type metal layer will enable the formation of an NMOS gate electrode with a work function that is between about 3.9 eV and about 4.2 eV.

As shown, gate structures 150 are of differing lengths, L1-L4 along channel material 161. In the illustrated embodiment, gate structures 150 are of descending sizes (i.e., lengths) along the x-dimension with gate structure 151 having a greater length along channel material 161 than gate structure 152, gate structure 152 having a greater length along channel material 161 than gate structure 153, and gate structure 153 having a greater length along channel material 161 than gate structure 154. In other embodiments, gate structures 150 are of ascending sizes (i.e., lengths) extending from source 162 to drain 163. In some embodiments, gate structures 150 are in an alternating pattern of sizes (i.e., lengths).

Although illustrate with respect to four gate structures 150, which is applicable to a four bit DAC 100, DAC 100 may include any number of gate structures such as two gate structures 150 (i.e., for a two bit DAC 100), three gate structures 150 (i.e., for a three bit DAC 100), and so on with any number of bits up to, for example, an eight bit device. The following provides exemplary gate structure lengths L1-L4 and length ratios, such examples may be provided in four gate structure devices, as illustrated or in DACs employing more or fewer gate structures 150 with some of the exemplary lengths and length ratios being elevated or extrapolated from the following examples.

In some embodiments, the ratios of lengths L1, L2, L3, L4 are provided to allow differentiation of current signals depending on the combination of gates that are activated. For example, DAC 100 needs to differentiate between bits applied to each of gate structures 150 in all combinations. In some embodiments, the ratio of L3 to L4 is provided to differentiate between a signal applied to gate structure 154 but not gate structure 153. In some embodiments, length L4 not more than half length L3 to differentiate between such digital signals. Similarly, in some embodiments, length L3 is not more than half length L2 and/or length L2 is not more than half length L1. Such doubling of lengths from shortest to longest lengths (i.e., L3=2*L4, L2=2*L3, L1=2*L2, and so on) provides for differentiate from, for example, a LSB deployed using gate structure 154, to a bit deployed using gate structure 153, to a bit deployed using gate structure 152, and to a MSB deployed using gate structure 151. In the illustrated 4 bit example, the MSB gate structure may have a length about eight times the LSB gate structure length. In some embodiments, the MSB gate structure has a length that is the length of the LSB gate structure times two to the power of the number of bits deployed minus one (i.e., L1=L4*2^(NB−1) where NB is the number of bits). Other length ratios may be deployed. In some embodiments, a length ratio of 3 to 1 is used (i.e., L3=3*L4, L2=3*L3, L1=3*L2, and so on).

In some embodiments, a length ratio of 4 to 1 is used (i.e., L3=4*L4, L2=4*L3, L1=4*L2, and so on). In some embodiments, a length ratio in the range of 1.5 to 4 is used. In some embodiments, the length ratio is not less than 1.5. In some embodiments, the ratio between adjacent ones of gate structures is constant (as discussed). In some embodiments, the ratio is varied. For example, the ratio may be greater for smaller gate structure sizes than for larger gate structure sizes. In some embodiments, the ratio of L1 to L2 is in the range of 1.5 to 2.0 while the ratio of L3 to L4 is in the range of 2.0 to 4.0.

As shown, adjacent ones of gate structures 150 are separated by dielectric material 164 to electrically isolate adjacent ones of gate structures 150. Dielectric material 164 may be characterized as an isolation material and may be any material suitable for providing electrical isolation between gate structures 150. In some exemplary embodiments, dielectric material 164 is silicon dioxide. Other materials known to be suitable for the purpose may also be utilized, including low-k materials (e.g., having a relative dielectric constant below 2.5). In some embodiments, gate dielectric layer 165 extends along sidewalls 167 to provide isolation between gate structures 150 either with dielectric material 164 or exclusive of dielectric material 164. Such isolation material(s) may have any length along channel material 161 such as lengths in the range of 2 to 10 nm.

Figures 3, 4:
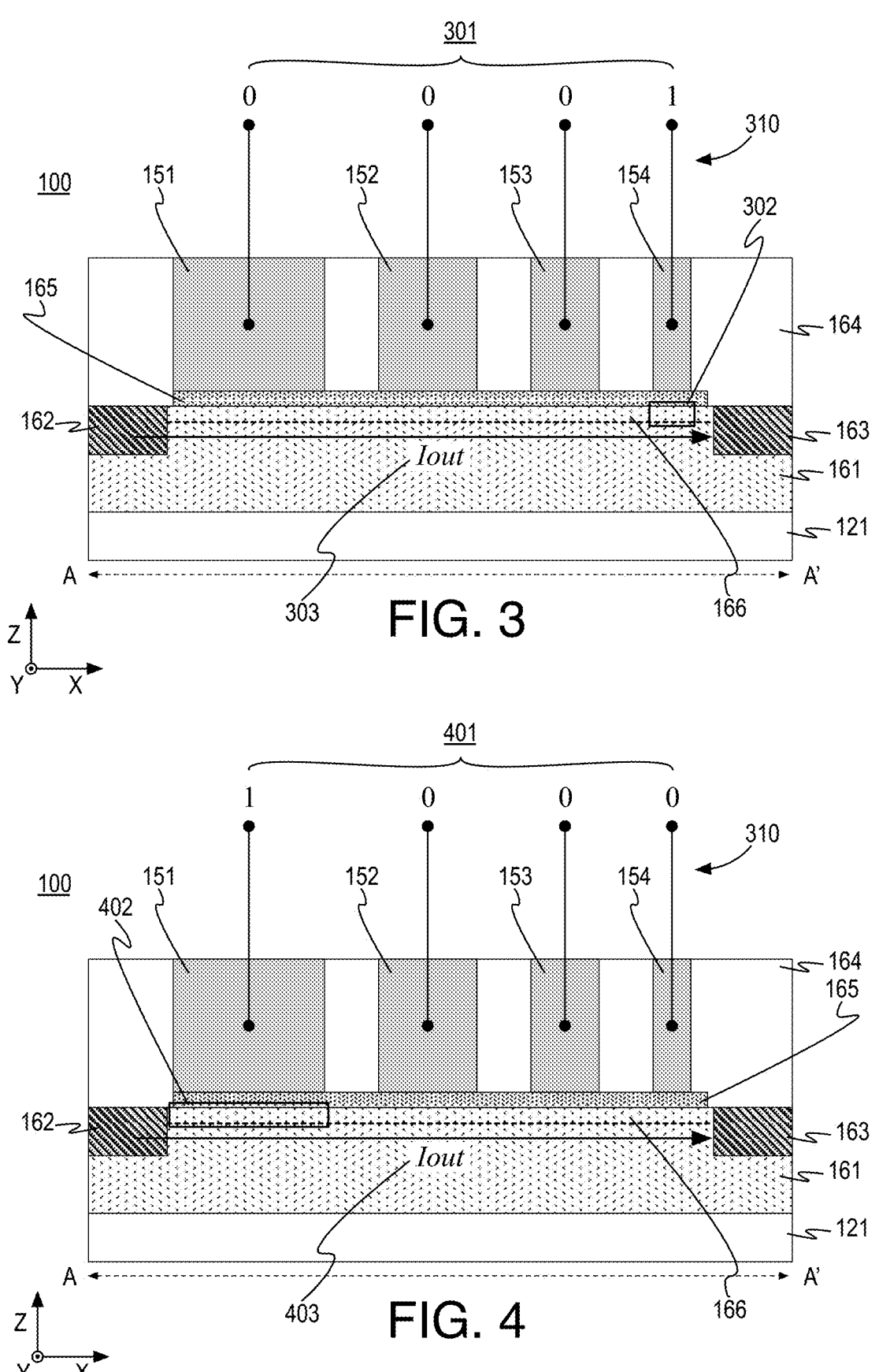
FIG. 3 illustrates a cross-sectional view of the multi-sized multiple gate digital to analog converter of FIG. 1 in operation with only a lowest significant bit signal applied.
FIG. 4 illustrates a cross-sectional view of the multi-sized multiple gate digital to analog converter of FIG. 1 in operation with only a most significant bit signal applied.

FIG. 3 illustrates a cross-sectional view of multi-sized multiple gate digital to analog converter 100 in operation with only a lowest significant bit signal applied, arranged in accordance with at least some implementations of the present disclosure. As shown in FIG. 3, in operation, an input signal 301 is applied to DAC 100 using control lines 310. Each of gate structures 150 is connected to a separate one of control lines 310 such that an individual bit (e.g., activated or not activated, or on or off) may be applied to each of gate structures 150. Control lines 310 may be implemented using any suitable technique or techniques in some embodiments, control lines 310 are implemented as a route in metallization layers formed over DAC 100, as illustrated herein with respect to FIG. 7 and elsewhere.

Input signal 301, in this example, is a 4-bit digital signal to be converted to an analog value. For example, DAC 100 may receive a time series of digital signals (of which current input signal 301 is one) that approximate an analog signal. DAC 100 then outputs an analog signal corresponding to a current 303 (Iout) that depends on input signal 301 and the other digital signals in the time series of digital signal. Current 303 may be optionally amplified or otherwise adjusted prior to output from the IC system in which DAC 100 is implemented.

In the example of FIG. 3, input signal 301 activates gate structure 154, but does not activate gate structures 151, 152, 153. For example, input signal 301 may correspond to a binary input of 0001 (e.g., a value of 1 in base 10). In some embodiments, gate structure 154 corresponds to a LSB of input signal 301 and has a smallest interface with channel material 161.

As shown, activation of gate structure 154 provides a modification 302 of channel material 161 immediately adjacent and under gate structure 154. For example, modification 302 may be an inversion of channel material 161 to provide more charge carriers (electrons or holes) immediately adjacent and under gate structure 154. Due to modification 302, current 303 of DAC 100 is increased above a baseline current (i.e., a very low or essentially zero current). Current 303, as the lowest current (outside of the baseline current, if any) possible by DAC 100 may be output as the current corresponding to a value of 0001 (e.g., a value of 1 in base 10). Thereby, the LSB of input signal 301 corresponds to a smallest current. In examples where other bits are activated, the activation or deactivation of the LSB provides differentiation between adjacent values. For example, the current for an input value of 1100 (e.g., a value of 12 in base 10) and the current for an input value of 1101 (e.g., a value of 13 in base 10) differ by the amount of current added by the activation of gate structure 154. It is noted that a 4-bit DAC 100 may receive input values from 0000 to 1111 (e.g., values of 0 to 15 in base 10) and DAC 100 outputs an analog current for each such input value such that the analog currents are meaningfully distinct from one another.

FIG. 4 illustrates a cross-sectional view of multi-sized multiple gate digital to analog converter 100 in operation with only a most significant bit signal applied, arranged in accordance with at least some implementations of the present disclosure. In operation, an input signal 401 is applied to DAC 100 using control lines 310. Input signal 401 activates only gate structure 151, which corresponds to a MSB of the input signal, and may be contrasted with input signal 301, which activates only gate structure 154, corresponding to a LSB of the input signal. For example, input signal 401 has a binary value of 1000 (e.g., a one in the leading MSB position), corresponding to a base 10 value of 8.

As shown, input signal 401 activates gate structure 151, but does not activate gate structures 152, 153, 154. For example, input signal 301 may correspond to a binary input of 0001 (e.g., a value of 1 in base 10). Activation of gate structure 151 provides a modification 402 of channel material 161 immediately adjacent and under gate structure 151. For example, modification 402 may be an inversion of channel material 161 to provide more charge carriers (electrons or holes) immediately adjacent and under gate structure 151. Modification 402 may be contrasted with modification 302 in that modification 402 modifies or alters a much larger region of channel material 161 between source 162 and drain 163. In some embodiments, gate structure 151 is eight times larger than gate structure 154 (and four times larger than gate structure 153, and twice the size of gate structure 152). Such greater volume of modification 402 of channel material 161 provides a corresponding increase in output current 403.

For example, similar to modification 302, due to modification 402, output current 403 of DAC 100 is increased above the baseline current and, in some embodiments, to a level about eight times that of current 303. Thereby, current 403 provides a meaningful MSB current (i.e., 1000 is 8 in base 10, and 0001 is 1 in base 10). By providing current 403 at about eight times that of current 303, corresponding differentiation in the output current is also provided. For example, if the current of an input value of 0010 is about twice the current of an input value of 0001, an input value of 0100 is about twice the current of an input value of 0010, and an input value of 1000 is about twice the current of an input value of 0100, and so on, digital to analog conversion of the input signal is achieved. As discussed, in some embodiments, length ratios of about 2 to 1 (i.e., L3=2*L4, L2=2*L3, L1=2*L2, and so on) may be used to provide the corresponding digital to analog conversion. However, depending on materials deployed, architecture, and other factors other ratio(s) may be used.

Current 403, as the MSB current deployed by DAC 100 is output as the current corresponding to a value of 1000 (e.g., a value of 8 in base 10). Current 403 is therefore significant in providing accuracy in conversion of the input signal. As discussed, in examples where other bits are activated, the activation or deactivation of the MSB provides a level set increase. For example, the current for an input value of 0111 (e.g., a value of 7 in base 10) and the current for an input value of 1111 (e.g., a value of 15 in base 10) differ by the amount of current added by the activation of gate structure 151. By activation or deactivation of each of gate structures 150, an output current corresponding to each possible digital input is then provided. Notably, the output current (e.g., analog output) is directly proportional to the area of channel material 161 under gates that are activated.

Figures 5, 6:
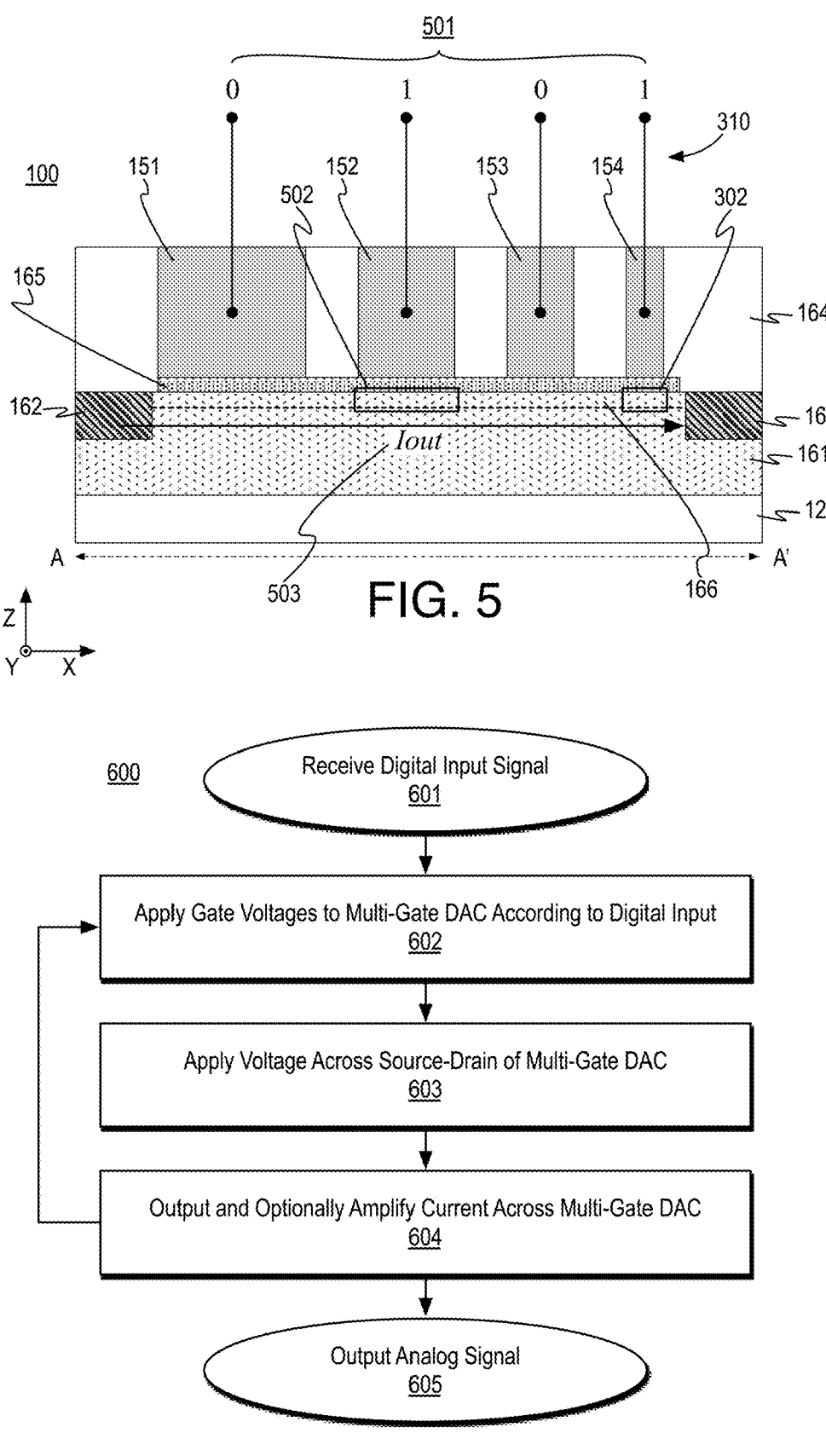
FIG. 5 illustrates a cross-sectional view of the multi-sized multiple gate digital to analog converter of FIG. 1 in operation with a digital input signal applied.
FIG. 6 is a flow diagram illustrating an example process for performing a digital to analog conversion using the multi-sized multiple gate digital to analog converter of FIG. 1.

FIG. 5 illustrates a cross-sectional view of multi-sized multiple gate digital to analog converter 100 in operation with a digital input signal applied, arranged in accordance with at least some implementations of the present disclosure. In operation, an input signal 501 is applied to DAC 100 using control lines 310, as discussed. In this example, gate structures 152, 154 are activated and gate structures 151, 153 are not. Input signal 501 (i.e., 0101) corresponds to a base input of five and activates the LSB corresponding to gate structure 154 but not the MSB corresponding to gate structure 151.

Activation of gate structures 152, 154 provides modifications 302, 502 of channel material 161 immediately adjacent and under gate structures 152, 154. For example, modifications 302, 502 may be an inversion of channel material 161 to provide more charge carriers (electrons or holes) immediately adjacent and under gate structures 152, 154. Modifications 302, 502 modify or alter an area (i.e., in the x-y plane) or volume approximately proportional to the value of input signal 501. In this example, input signal 501 corresponds to five and the area of coupling between gate structures 152, 154 and channel material 161 is about five times that of the area of gate structure 154 alone. For example, the area of activated gate structure may be proportional to the input value being converted to an analog signal.

Current 503, as corresponding to input signal 501 is output from DAC 100. Current 503 may be optionally amplified, sensed, and so on as part of a DAC IC system module or implementation. Thereby, the output from DAC 100 is proportional to the digital input signal and is an analog conversion of the digital input. Such processing may be repeated over the course of a time series of such digital inputs.

FIG. 6 is a flow diagram illustrating an example process 600 for performing a digital to analog conversion using multi-sized multiple gate digital to analog converter 100, arranged in accordance with at least some implementations of the present disclosure. As shown, process 600 begins at operation 601, where a digital input signal is received for processing. The digital input signal may be representative of any suitable data set such as a digital representation of waveform to be converted to an analog representation. Furthermore, the digital representation may be in any data signal processing context such as video processing, audio processing, signal processing, communications processing, etc. The digital input signal may include any number of bits such as 2 bits, 3, bits, 4 bits, or more.

Processing continues at operation 602, where for a particular instance of the digital signal (e.g., one binary value representation), the appropriate gates of the multi-sized multiple gate digital to analog converter are activated. For example, when the MSB is a one, the largest gate structure is activated and when the LSB is a one, the smallest gate structure is activated. Similarly, for bits between the LSB and the MSB, the corresponding gate structure is activated as discussed herein.

Processing continues at operation 603, where, during activation of the gates in accordance with operation 602, a voltage is applied across the source and drain of the multi-sized multiple gate digital to analog converter. The applied voltage may be any suitable voltage for detection of a current across the multi-sized multiple gate digital to analog converter. In some embodiments, the voltage is applied substantially constantly during deployment of the multi-sized multiple gate digital to analog converter. In some embodiments, the voltage is applied in a manner such that it is timed with activation of the gate structures.

Processing continues at operation 604, where the current across the multi-sized multiple gate digital to analog converter during voltage application across the source and drain and simultaneous activation of the pertinent gate structures is output and optionally amplified. In some embodiments, the current is output at a pin of an IC device deploying the multi-sized multiple gate digital to analog converter. In some embodiments, the current is provided to a functional block of the IC device. In some embodiments, the current is amplified using, for example, linear amplification techniques.

As shown, processing may continue in a loop such that, for a next digital input value, the pertinent gate structures are activated, the voltage across the source and drain is applied (or maintained), and the current corresponding to the next digital input value is output. Such processing may be repeated for any number of digital input values to provide conversion of the digital input values.

When such processing is complete, processing continues at end operation 605, where the analog signal is output. In some embodiments, the analog signal is output as the digital values are converted although delay techniques may be deployed.

Figure 7:
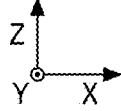
FIG. 7 illustrates a cross-sectional view of a low temperature multi-sized multiple gate digital to analog converter integrated circuit system with cooling.

FIG. 7 illustrates a cross-sectional view of a low temperature multi-sized multiple gate digital to analog converter integrated circuit system 700 with cooling, arranged in accordance with at least some implementations of the present disclosure. In FIG. 7, an orthogonal to gate view is provided for transistors such that orthogonal to the gate refers to the gate of transistors 101. As shown, in some embodiments, transistors 101 and DAC 100 are provided over shared substrate 121.

IC system 700 includes a lateral surface along the x-y plane that may be defined or taken at any vertical position of IC system 700. The lateral surface of the x-y plane is orthogonal to a vertical or build up dimension as defined by the z-axis. IC system 700 may be formed from any substrate 121 discussed herein. As shown, in some embodiments, transistors 101 and DAC 100 are laterally adjacent in IC system 700. In some embodiments, channel material 161 is shared with a channel region 106 of transistors 101 such that channel material 161 and channel region 106 are the same material.

In FIG. 7, IC system 700 includes an IC die 102, which is a monolithic integrated circuit including transistors 101, DAC 100 (i.e., one or more DACs), front-side metallization layers 104 (or front-side interconnect layers), and optional back-side metallization layers (or back-side interconnect layers, not shown). IC system 700 further includes a package level cooling structure 103, which may be deployed on or over front-side metallization layers 104 (as shown) or on or over a back-side of IC die 102 (as illustrated elsewhere herein). In some embodiments, package level cooling structure 103 is coupled to IC die 102 by an adhesion layer 116. Adhesion layer 116 may be formed on or over the front-side of IC die 102 (as shown) or on or over a back-side of IC die

102 (as illustrated elsewhere herein). In some embodiments, package level cooling structure 103 is provided proximal to, but not necessarily directly on, IC die 102. For example, IC die 102 may be deployed as part of a multi-chip stack or multi-chip package and package level cooling structure 103 may be provided on or over another die in the stack.

Transistors 101 each include channel region 106 between a source 107 and a drain 108 (e.g., source and drain semiconductors). Transistors 101 each further include source and drain contacts 112, 113 to in contact with source 107 and drain 108 and a gate structure including a gate electrode 105 and a gate dielectric layer 114. Similarly, DAC 100 includes source and drain contacts 122, 123, which are coupled to metallization structures (not shown), which provide the source/drain voltage discussed herein. Each of gate structures 150 is coupled to one of control lines 310, which may be implemented in front-side metallization layers 104. As used herein, the term front- and back-side are used in their ordinary meaning in the art based on the buildup direction of IC die 102 with the front-side being the side exposed during processing. The back-side is then the opposite side, which may be exposed during processing by attaching the front-side to a carrier wafer and exposing the back-side (e.g., by back-side grind or etch operations). Back-side interconnect layers, if used, may be fabricated on the exposed back-side as known in the art.

At least a portion of gate dielectric layer 114 is on at least a portion of channel region 106 and between channel region 106 and gate electrode 105, such that gate electrode 105 may control channel region 106 during operation. In the examples herein, gate dielectric layer 114 is on a bottom and sidewalls of gate electrode 105. In other embodiments, gate dielectric layer 114 is only on a bottom of gate electrode 105 but is absent sidewalls of gate electrode 105. Gate dielectric layer 114 and gate electrode 105 may deploy any materials such as those discussed with respect to gate structures 150 and gate dielectric layer 165. Optional dielectric spacers 134 may be provided between the gate structure and each of source and drain contacts 112, 113. As shown, transistors 101, DAC 100 and front-side metallization layers 104 are embedded within dielectric material layers 142, 143, 144.

In some embodiments, drain 108 (e.g., via drain contact 113 and metallization routing, not shown) of transistor 101 is coupled to one of gate structures 150 (e.g., via one of control lines 310). For example, one of transistors 101 may be used as a switch to turn on and off the activation of one of gate structures 150 based on a digital input as discussed above. For example, transistors 101 may provide control transistors (or access transistors) to control DAC 100 based on a digital input signal. Although illustrated with respect to planar transistors 101, any transistor architecture may be deployed such as a Fin FET architecture, a nanosheet FET architecture, or the like. Interconnectivity of transistors 101 and DAC 100 is provided by front-side metallization layers 104. As used herein, the term metallization layer indicates metal interconnections or wires that provide electrical routing. In the illustrated example, front-side metallization layers 104 include V0, M1, V1, M2, V2, M3, V3, M4, V4, M5, V5, M6, V6, M7, V7, and M8. However, front-side metallization layers 104 may include any number of metallization layers such as eight or more metallization layers.

As discussed, IC system 700 includes IC die 102 and an active cooling structure operable to remove heat from IC die 102 to achieve a very low operating temperature of IC die 102. As used herein, the term very low operating temperature indicates a temperature at or below 0° C., although even lower temperatures such as an operating temperature at or below −50° C., an operating temperature at or below −70° C., an operating temperature at or below −100° C., an operating temperature at or below −180° C., or an operating temperature at or below −196° C. may be used. In some embodiments, the operating temperature is in a cryogenic temperature operating window (e.g., about −180° C. to about −70° C.). As used herein, the term cooling structure or active cooling structure indicates a device that uses power to provide cooling (e.g., via flow of a coolant, immersion in a coolant, etc.). Notably, the cooling structure or active cooling structure need not be in operation to be labeled as such. The active cooling structure may be provided as a package level structure (i.e., separable from IC die 102), as a die level structure (i.e., integral to IC die 102), or both. In some embodiments, an active cooling structure is not needed as IC die 102 is deployed in a sufficiently cold temperature environment.

Figure 8:
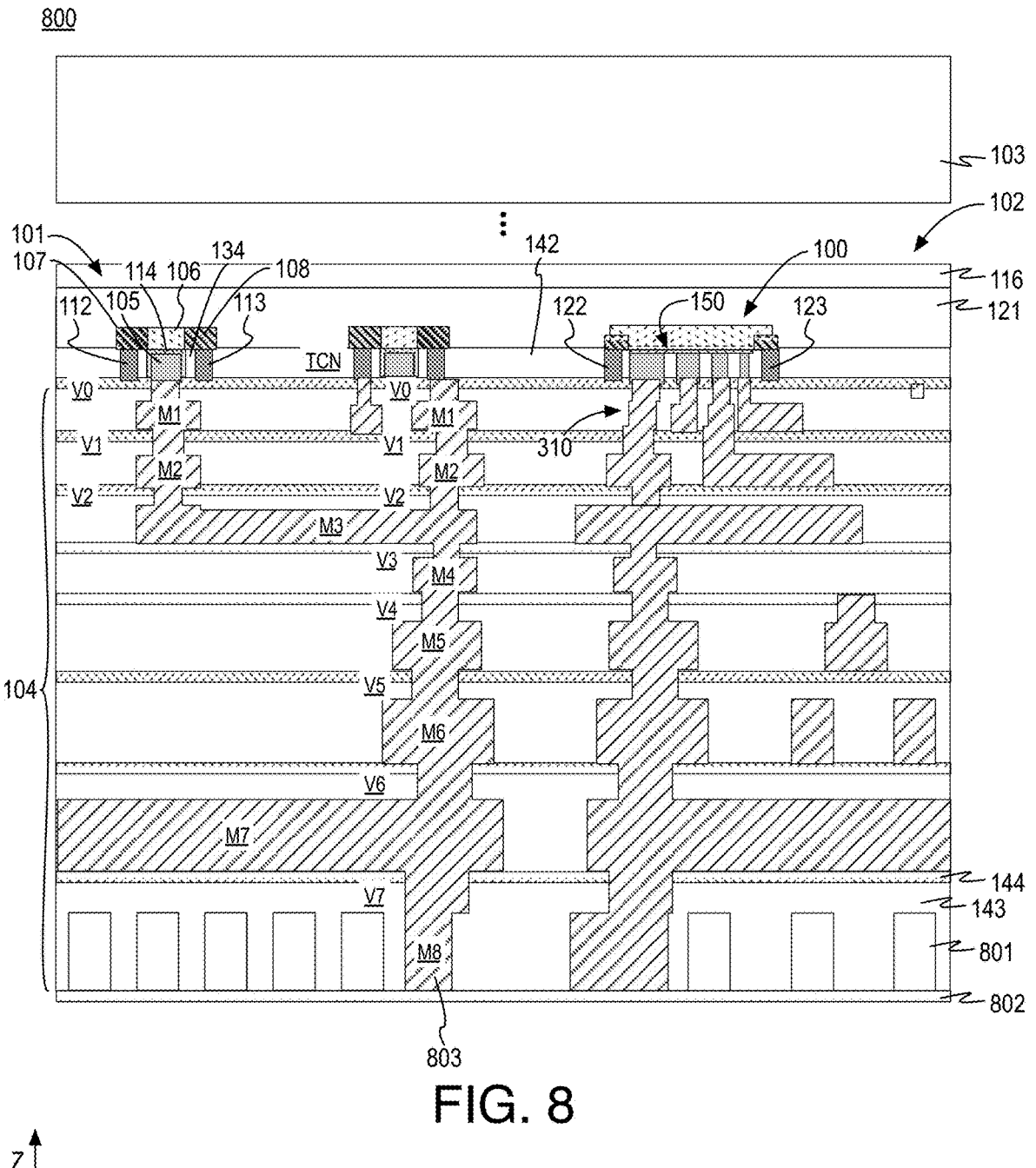
FIG. 8 illustrates a cross-sectional view of a low temperature multi-sized multiple gate digital to analog converter integrated circuit system using die level cooling.

FIG. 8 illustrates a cross-sectional view of a low temperature multi-sized multiple gate digital to analog converter integrated circuit system 800 using die level cooling, arranged in accordance with at least some implementations of the present disclosure. In FIG. 8 and elsewhere herein, like numerals are used to indicate like structures or components that may have any characteristics discussed elsewhere herein. In the example of IC system 800, IC die 102 includes active cooling structures or components to remove heat from IC die 102 to achieve an operating temperature of IC die 102 at or below a target temperature such as 0° C. or any other operating or target temperature discussed herein.

In IC system 800, IC die 102 includes die level active cooling as provided by microchannels 801. Microchannels 801 are to convey a heat transfer fluid therein to remove heat from IC die 102. The heat transfer fluid may be any suitable liquid or gas. In some embodiments, the heat transfer fluid is liquid nitrogen operable to lower the temperature of IC die to a temperature at or below about −196° C. In some embodiments, the heat transfer fluid is a fluid with a cryogenic temperature operating window (e.g., about −180° C. to about −70° C.). In some embodiments, the heat transfer fluid is one of helium-3, helium-4, hydrogen, neon, air, fluorine, argon, oxygen, or methane.

As used herein, the term microchannels indicates a channel to convey a heat transfer fluid with the multiple microchannels providing discrete separate channels or a network of channels. Notably, the plural microchannels does not indicate separate channel networks are needed. Such microchannels 801 may be provided in any pattern in the x-y plane such as serpentine patterns, patterns of multiple parallel microchannels 801, or the like. Microchannels 801 couple to a heat exchanger (not shown) that removes heat from and cools the heat transfer fluid before re-introduction to microchannels 801. The flow of fluid within microchannels 801 may be provided by a pump or other fluid flow device. The operation of the heat exchanger, pump, etc. may be controlled by a controller.

In the illustrated embodiment, microchannels 801 are implemented at metallization level M8. In other embodiments, microchannels 801 are implemented over metallization level M8. Microchannels 801 may be formed using any suitable technique or techniques such as patterning and etch techniques to form the void structures of microchannels 801 and passivation or deposition techniques to form a cover structure 802 to enclose the void structures. As shown, in some embodiments, the active cooling structure of IC system 800 includes a number of microchannels 801 in IC die 102 and over a number of front-side metallization layers 104. As discussed, microchannels 801 are to convey a heat transfer fluid therein.

In some embodiments, a metallization feature 803 of metallization layer M8 (and/or V7) is laterally adjacent to microchannels 801. For example, metallization feature 803 may couple to a package level interconnect structure (not shown) for signal routing for IC die 102. In the example of IC system 800, package level cooling structure 103 may be a passive heat removal device such as a heat sink or the like. In some embodiments, package level cooling structure 103 is deployed on a back-side of IC die 102. As shown, in some embodiments, package level cooling structure 103 is deployed on or over a back-side of IC die 102. In some embodiments, package level cooling structure 103 is secured to IC die by adhesion layer 116. In some embodiments, package level cooling structure 103 is deployed on or over a front-side of IC die 102. In some embodiments, package level cooling structure 103 is not deployed in IC system 800.

Figure 9:
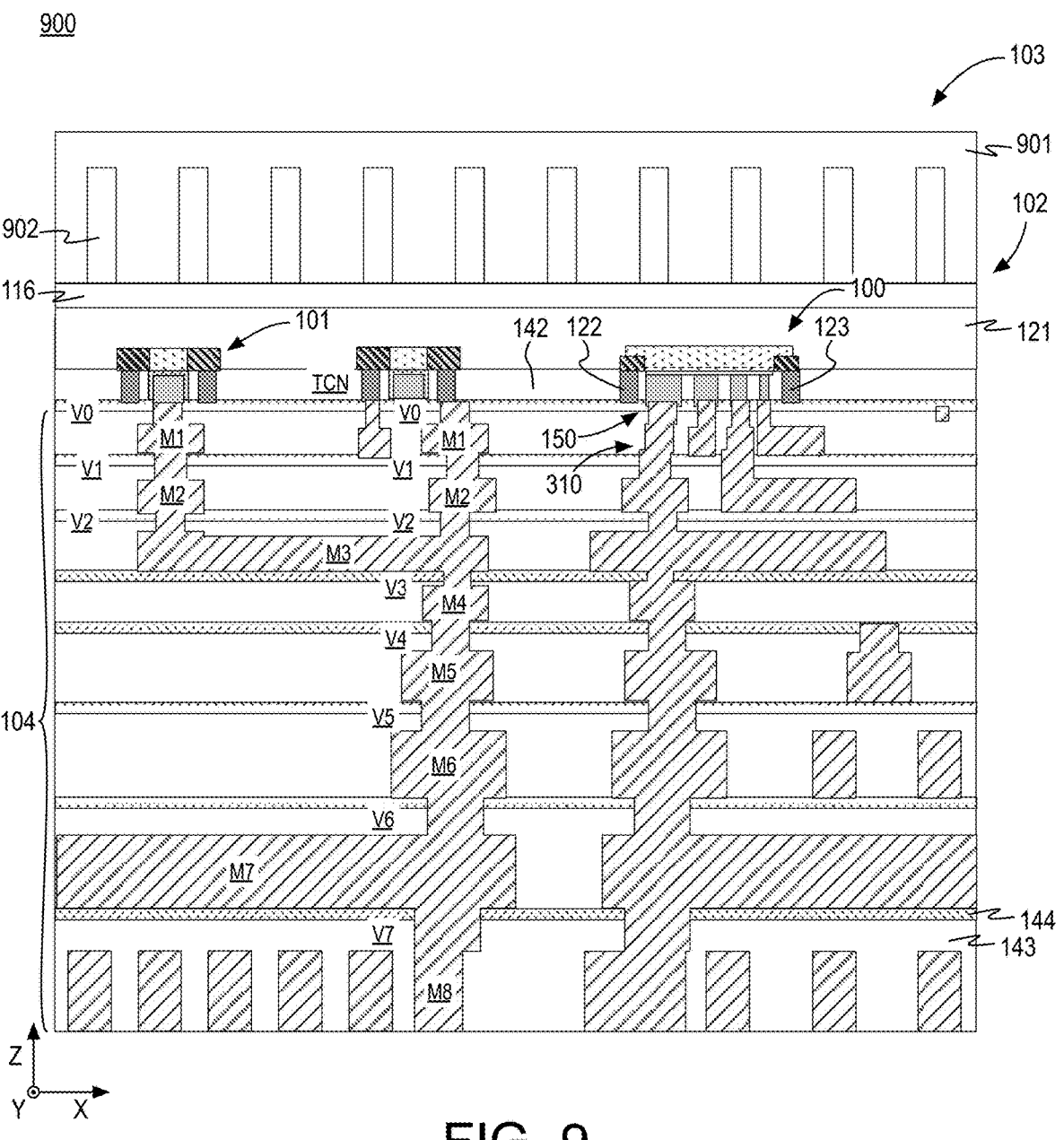
FIG. 9 illustrates a cross-sectional view of a low temperature multi-sized multiple gate digital to analog converter integrated circuit system using package level cooling.

FIG. 9 illustrates a cross-sectional view of a low temperature multi-sized multiple gate digital to analog converter integrated circuit system 900 using package level cooling, arranged in accordance with at least some implementations of the present disclosure. In the example of IC system 900, package level cooling structure 103 includes active cooling structures or components to remove heat from IC die 102 to achieve an operating temperature of IC die 102 at or below a target temperature such as 0° C. or any other operating or target temperature discussed herein.

In IC system 900, package level cooling structure 103 includes an active cooling structure 901 having microchannels 902. Microchannels 902 are to convey a heat transfer fluid therein to remove heat from IC die 102. The heat transfer fluid may be any suitable liquid or gas as discussed with respect to FIG. 8. Microchannels 902 may be provided in any pattern in the x-y plane such as serpentine patterns, patterns of multiple parallel microchannels 902, etc. Microchannels 902 couple to a heat exchanger (not shown) that removes heat from and cools the heat transfer fluid before re-introduction to microchannels 902. The flow of fluid within microchannels 902 may be provided by a pump or other fluid flow device. The operation of the heat exchanger, pump, etc. may be controlled by a controller. In the illustrated embodiment, active cooling structure 901 is a chiller mounted to a back-side of IC die 102 such that the chiller has a solid body having microchannels therein to convey a heat transfer fluid. In some embodiments, substrate 121 is thinned prior to application of package level cooling structure 103. In some embodiments, package level cooling structure 103 is attached over a front side of IC die 102 (e.g., over metallization layers 104). As discussed, in some embodiments, back side metallization may be provided opposite metallization layers 104.

Figure 10:
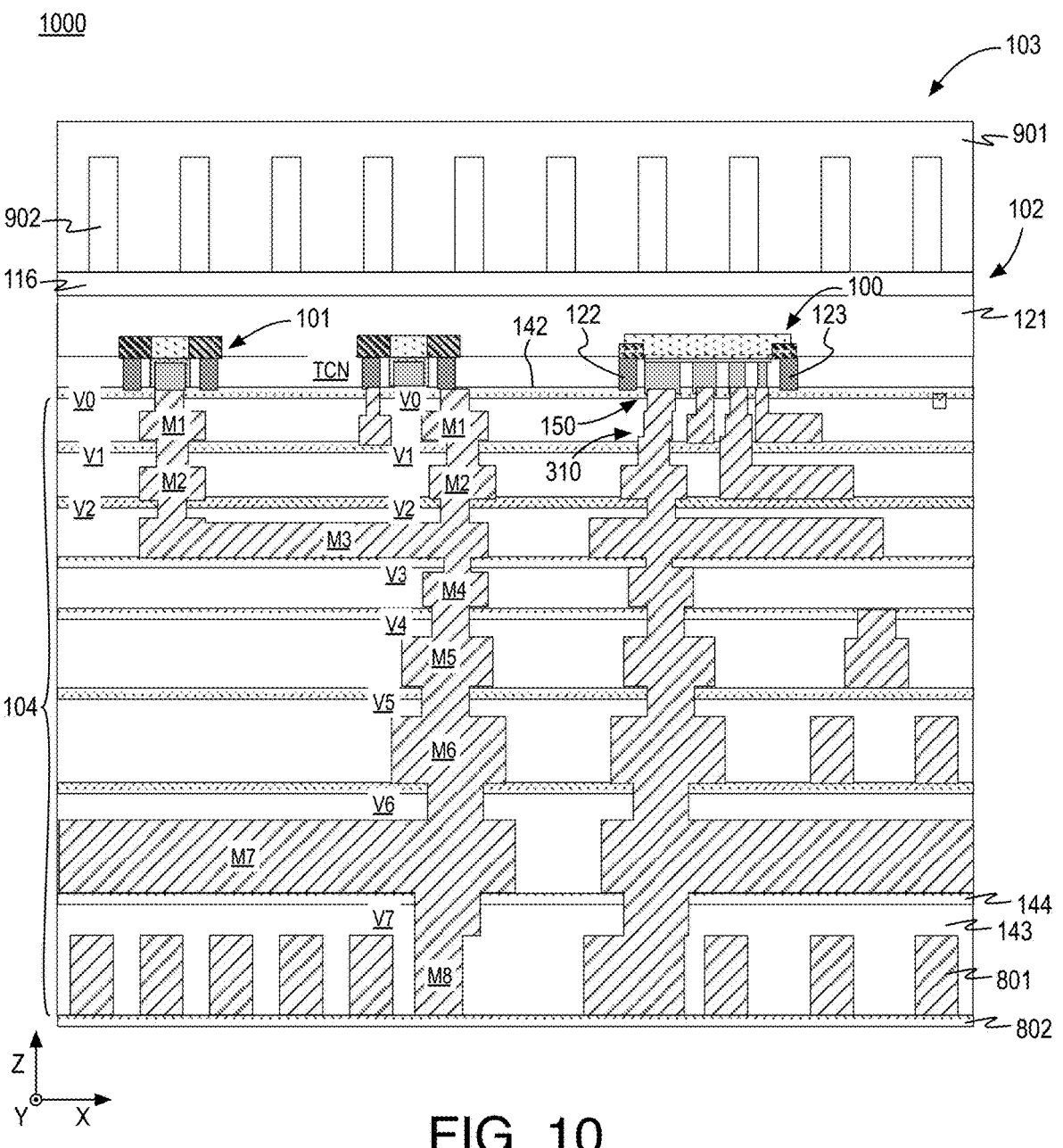
FIG. 10 illustrates a cross-sectional view of a low temperature multi-sized multiple gate digital to analog converter integrated circuit system using die level and package level cooling.

FIG. 10 illustrates a cross-sectional view of a low temperature multi-sized multiple gate digital to analog converter integrated circuit system 1000 using die level and package level cooling, arranged in accordance with at least some implementations of the present disclosure. In the example of IC system 1000, IC die 102 includes active cooling structures or components as provided by both microchannels 801 and active cooling structure 901.

In some embodiments, the heat removal fluid deployed in microchannels 801 and active cooling structure 901 are coupled to the same pump and heat exchanger systems. In such embodiments, the heat removal fluid conveyed in both microchannels 801 and active cooling structure 901 are the same material. Such embodiments may advantageously provide simplicity. In other embodiments, the heat removal fluids are controlled separately. In such embodiments, the heat removal fluids conveyed by microchannels 801 and active cooling structure 901 may be the same or they may be different. Such embodiments may advantageously provide improved flexibility. In some embodiments, package level cooling structure 103 is attached over a back side of IC die 102 (e.g., over substrate 121, which may be thinned).

Figure 11:
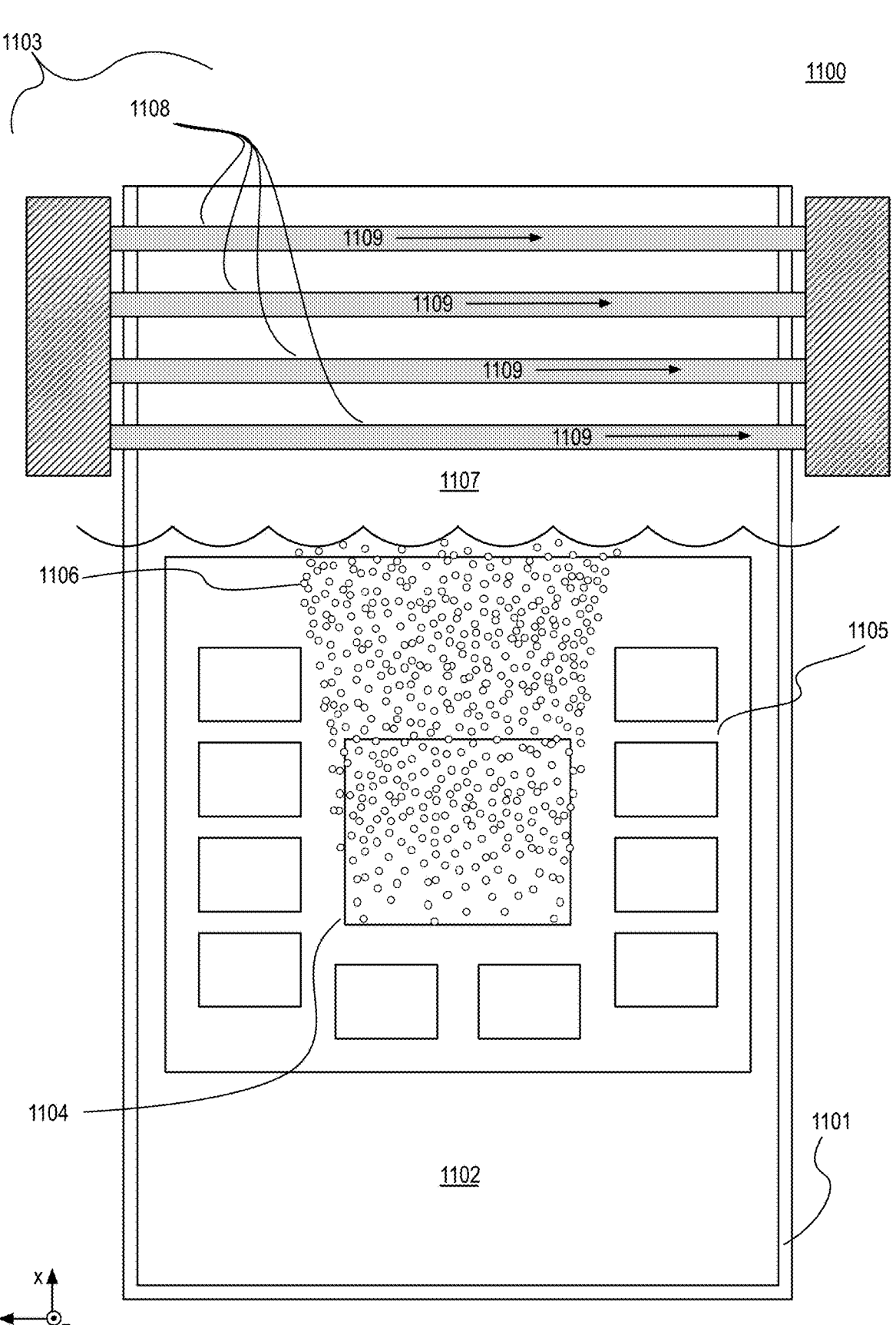
FIG. 11 illustrates a view of an example two-phase immersion cooling system for low temperature operation of an integrated circuit die having a multi-sized multiple gate digital to analog converter.

FIG. 11 illustrates a view of an example two-phase immersion cooling system 1100 for low temperature operation of an integrated circuit die having a multi-sized multiple gate digital to analog converter, arranged in accordance with at least some implementations of the present disclosure. As shown, two-phase immersion cooling system 1100 includes a fluid containment structure 1101, a low-boiling point liquid 1102 within fluid containment structure 1101, and a condensation structure 1103 at least partially within fluid containment structure 1101. As used herein, the term low-boiling point liquid indicates a liquid having a boiling point in the very low temperature ranges discussed. In some embodiments, the low-boiling point liquid is one of helium-3, helium-4, hydrogen, neon, air, fluorine, argon, oxygen, or methane.

In operation, a heat generation source 1104, such as an IC package including any of IC systems 700, 800 900, 1000 as discussed herein is immersed in low-boiling point liquid 1102. In some embodiments, IC systems 700, 800 900, 1000 as deployed in two-phase immersion cooling system 1100 do not include additional active cooling structures, although such die level or package level active cooling structures may be used in concert with two-phase immersion cooling system 1100. In some embodiments, when deployed in two-phase immersion cooling system 1100, package level cooling structure 103 is a heat sink, a heat dissipation plate, a porous heat dissipation plate or the like.

Notably, IC die 102, deploying one or more multi-sized multiple gate digital to analog converters is the source of heat in the context of two-phase immersion cooling system 1100. For example, IC die 102 may be packaged and mounted on electronics substrate 1105. Electronic substrate 1105 may be coupled to a power supply (not shown) and may be partially or completely submerged in low-boiling point liquid 1102.

In operation, the heat produced by heat generation source 1104 vaporizes low-boiling point liquid 1102 as shown in vapor or gas state as bubbles 1106, which may collect, due to gravitational forces, above low-boiling point liquid 1102 as a vapor portion 1107 within fluid containment structure 1101. Condensation structure 1103 may extend through vapor portion 1107. In some embodiments, condensation structure 1103 is a heat exchanger having a number of tubes 1108 with a cooling fluid (i.e., a fluid colder than the condensation point of vapor portion 1107) shown by arrows 1109 that may flow through tubes 1108 to condense vapor portion 1107 back to low-boiling point liquid 1102. In the IC system of FIG. 11, package level cooling structure 103 includes a passive cooling structure such as a heat sink for immersion in low-boiling point liquid 1102.

Figure 12:
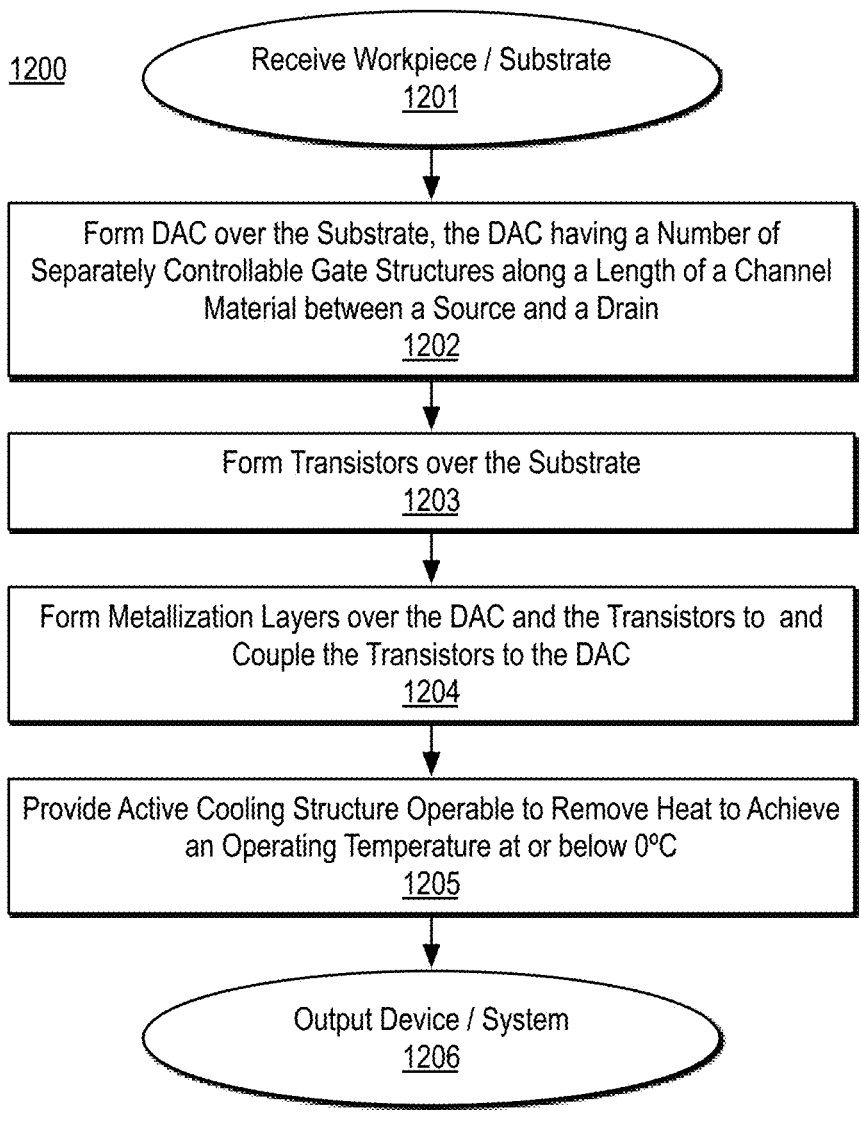
FIG. 12 is a flow diagram illustrating an example process for forming a multi-sized multiple gate digital to analog converter integrated circuit system.

FIG. 12 is a flow diagram illustrating an example process 1200 for forming a multi-sized multiple gate digital to analog converter integrated circuit system, arranged in accordance with at least some implementations of the present disclosure. As shown, process 1200 begins at operation 1201, where a workpiece or substrate is received for processing. The substrate may be any substrate discussed herein such as those discussed with respect to FIG. 1. In some embodiments, the substrate is a wafer.

Processing continues at operation 1202, where a digital to analog converter is formed over the substrate such that the digital to analog converter has a number of separately controllable gate structures along a length of a channel material between a source and a drain. The digital to analog converter may include any characteristics discussed herein. Such digital to analog converters may be formed using any suitable technique or techniques such as patterning techniques, etch techniques, deposition techniques, implant techniques, planarization techniques, and so on as known in the art. For example, multi-sized multiple gate digital to analog converter 100 may be formed at operation 1202.

Processing continues at operation 1203, where a number of transistors are formed over the substrate. In some embodiments, operations 1202 and 1203 are performed at least partially in parallel. Such transistors (i.e., control transistors) may be formed using any suitable technique or techniques such as patterning techniques, etch techniques, deposition techniques, implant techniques, planarization techniques, and so on as known in the art. For example, transistors 101 may be formed at operation 1203.

Processing continues at operation 1204, where a number of metallization layers are formed over a front side of the multi-sized multiple gate digital to analog converter and the transistors. In some embodiments, the metallization layers are to provide signal routing and power routing for the devices. In some embodiments, a number of transistors are each coupled to a gate structure of the multi-sized multiple gate digital to analog converter to individually control each gate structure. The front-side metallization layers may be formed using any suitable technique or techniques such as dual damascene techniques, single damascene techniques, subtractive metallization patterning techniques, or the like. For example, front-side metallization layers 104 may be formed at operation 1203. In some embodiments, a number of metallization layers are formed over a back side of the devices. In some embodiments, the metallization layers are to provide power delivery for the devices. The back-side metallization layers may be formed using any suitable technique or techniques. In some embodiments, after front-side processing, the front-side of the wafer is attached to a carrier substrate and back side removal processing (e.g., back-side grind or etch) is used to thin the wafer. The devices may then be contacted from the back side using through via contacts. The back-side metallization layers are then formed using dual damascene, single damascene, subtractive metallization patterning, etc.

Processing continues at operation 1205, where an active cooling structure operable to remove heat from an IC die segmented from the processed wafer to achieve an operating temperature at or below 0° C. is provided. Any active cooling structure discussed herein may be provided at operation. Notably, in the context of die level active cooling, operation 1205 may be performed prior to wafer segmentation processing. As discussed, such die level active cooling may be formed by etching the void structures of the microchannels followed by deposition techniques to enclose the void structures. For example, microchannels 801 to convey a heat transfer fluid therein may be formed at operation 1205.

In addition or in the alternative, a package level active cooling structure is provided. In some embodiments, active cooling structure 901 having microchannels 902 may be separately formed and attached to an IC die separated from the wafer received at operation 1201. For example, the wafer may be diced, each IC die may be packaged and an active cooling structure 901 may be attached thereto. In some embodiments, a two-phase immersion cooling system as discussed with respect to FIG. 11 is provided as the package level active cooling structure.

Processing continues at operation 1206, where the resultant device or system is output for use. As discussed, the active cooling structure is operable to maintain a very low temperature for the IC die, and the IC die deploys a multi-sized multiple gate digital to analog converter circuitry for improved device performance.

Figure 13:
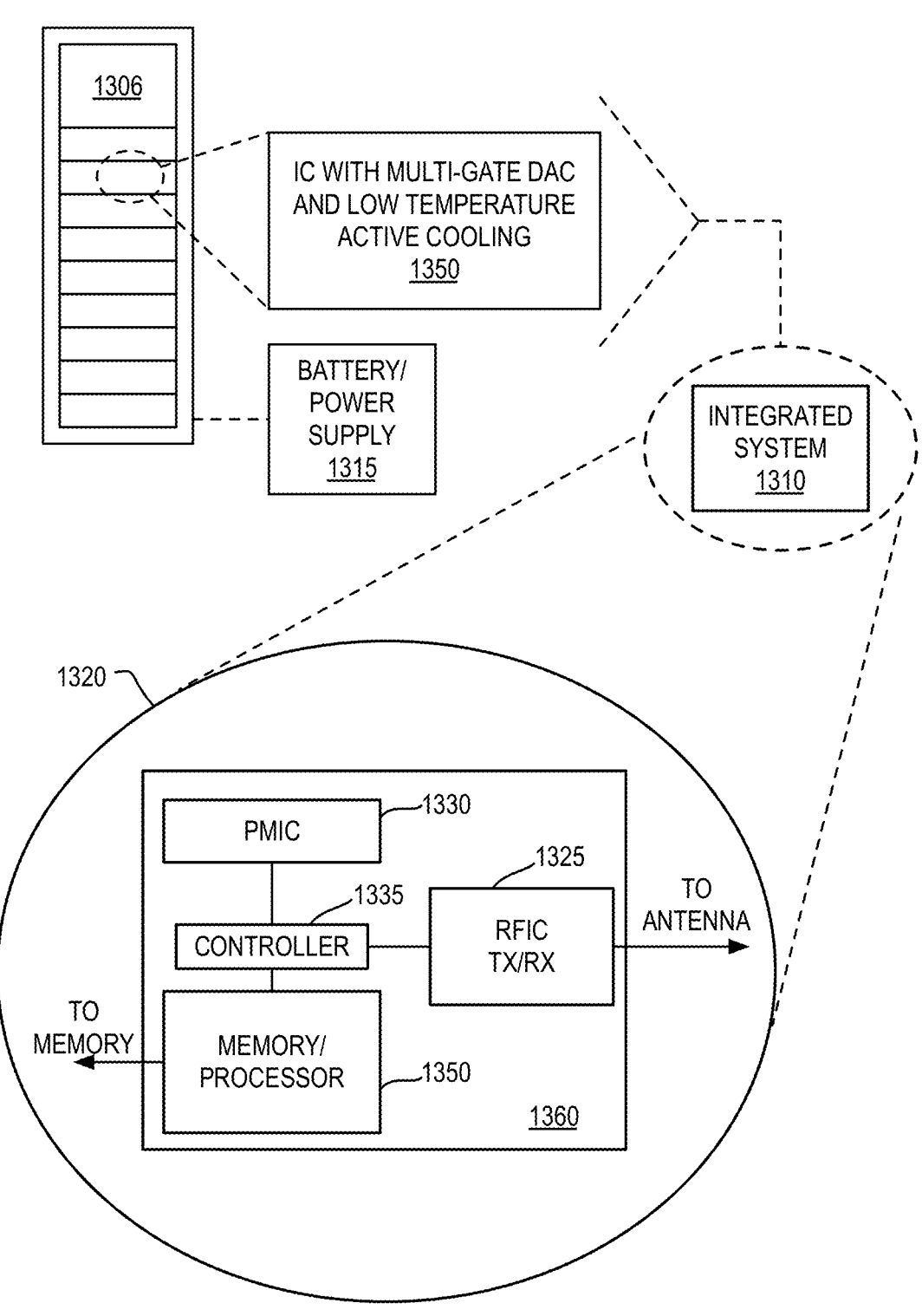
FIG. 13 illustrates diagram of an example data server machine employing a low temperature multi-sized multiple gate digital to analog converter integrated circuit system.

FIG. 13 illustrates diagram of an example data server machine 1306 employing a low temperature multi-sized multiple gate digital to analog converter integrated circuit system, arranged in accordance with at least some implementations of the present disclosure. Server machine 1306 may be any commercial server, for example, including any number of high-performance computing platforms disposed within a rack and networked together for electronic data processing, which in the exemplary embodiment includes one or more devices 1350 having an integrated circuit with functional circuit blocks having a multi-sized multiple gate digital to analog converter and low temperature active cooling operable to remove heat from the integrated circuit to achieve any low operating temperature discussed herein.

Also as shown, server machine 1306 includes a battery and/or power supply 1315 to provide power to devices 1350, and to provide, in some embodiments power delivery functions such as power regulation. Devices 1350 may be deployed as part of a package-level integrated system 1310. Integrated system 1310 is further illustrated in the expanded view 1320. In the exemplary embodiment, devices 1350 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 1350 is a microprocessor including an SRAM cache memory. As shown, device 1350 may employ a die or device having any transistor structures and/or related characteristics discussed herein. Device 1350 may be further coupled to (e.g., communicatively coupled to) a board, a substrate, or an interposer 1360 along with, one or more of a power management integrated circuit (PMIC) 1330, RF (wireless) integrated circuit (RFIC) 1325 including a wideband RF (wireless) transmitter and/or receiver (TX/RX) (e.g., including a digital baseband and an analog front end module further comprises a power amplifier on a transmit path and a low noise amplifier on a receive path), and a controller 1335 thereof.

Figure 14:
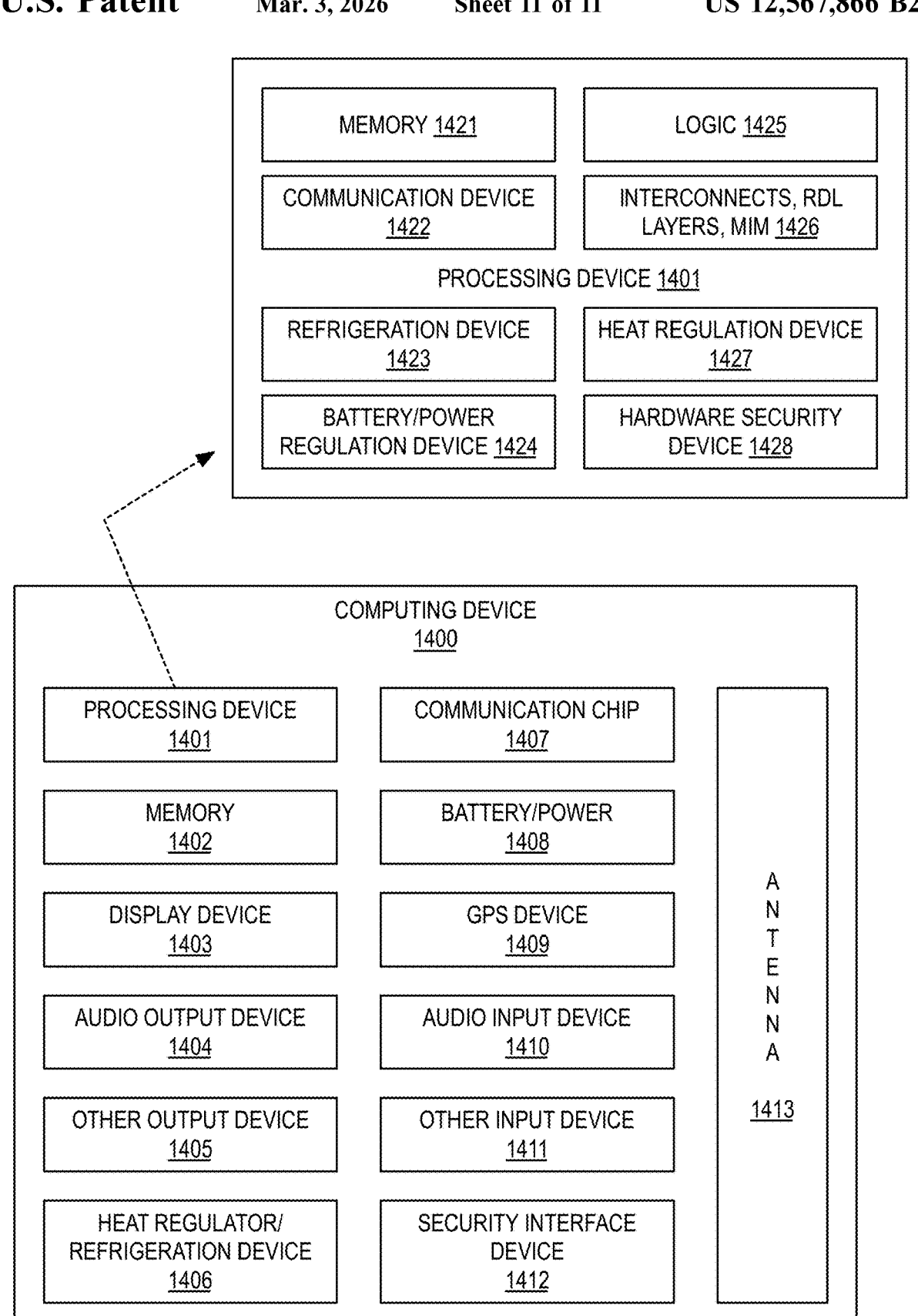
FIG. 14 is a block diagram of an example computing device, all arranged in accordance with at least some implementations of the present disclosure.

FIG. 14 is a block diagram of an example computing device 1400, arranged in accordance with at least some implementations of the present disclosure. For example, one or more components of computing device 1400 that may include any of the devices or structures discussed herein. A number of components are illustrated in FIG. 14 as included in computing device 1400, but any one or more of these components may be omitted or duplicated, as suitable for the application. In some embodiments, some or all of the components included in computing device 1400 may be attached to one or more printed circuit boards (e.g., a motherboard). In some embodiments, various ones of these components may be fabricated onto a single system-on-a-chip (SoC) die. Additionally, in various embodiments, computing device 1400 may not include one or more of the components illustrated in FIG. 14, but computing device 1400 may include interface circuitry for coupling to the one or more components. For example, computing device 1400 may not include a display device 1403, but may include display device interface circuitry (e.g., a connector and driver circuitry) to which display device 1403 may be coupled. In another set of examples, computing device 1400 may not include an audio output device 1404, other output device 1405, global positioning system (GPS) device 1409, audio input device 1410, or other input device 1411, but may include audio output device interface circuitry, other output device interface circuitry, GPS device interface circuitry, audio input device interface circuitry, audio input device interface circuitry, to which audio output device 1404, other output device 1405, GPS device 1409, audio input device 1410, or other input device 1411 may be coupled.

Computing device 1400 may include a processing device 1401 (e.g., one or more processing devices). As used herein, the term processing device or processor indicates a device that processes electronic data from registers and/or memory to transform that electronic data into other electronic data that may be stored in registers and/or memory. Processing device 1401 may include a memory 1421, a communication device 1422, a refrigeration device 1423, a battery/power regulation device 1424, logic 1425, interconnects 1426 (i.e., optionally including redistribution layers (RDL) or metal-insulator-metal (MIM) devices), a heat regulation device 1427, and a hardware security device 1428.

Processing device 1401 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Computing device 1400 may include a memory 1402, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 1402 includes memory that shares a die with processing device 1401. This memory may be used as cache memory and may include embedded dynamic random access memory (eDRAM) or spin transfer torque magnetic random-access memory (STT-M RAM).

Computing device 1400 may include a heat regulation/refrigeration device 1406. Heat regulation/refrigeration device 1406 may maintain processing device 1401 (and/or other components of computing device 1400) at a predetermined low temperature during operation. This predetermined low temperature may be any temperature discussed herein.

In some embodiments, computing device 1400 may include a communication chip 1407 (e.g., one or more communication chips). For example, the communication chip 1407 may be configured for managing wireless communications for the transfer of data to and from computing device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 1407 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1407 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1407 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1407 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1407 may operate in accordance with other wireless protocols in other embodiments. Computing device 1400 may include an antenna 1413 to facilitate wireless communications and/or to receive other wireless communications (such as AM or FM radio transmissions).

In some embodiments, communication chip 1407 may manage wired communications, such as electrical, optical, or any other suitable communication protocols (e.g., the Ethernet). As noted above, communication chip 1407 may include multiple communication chips. For instance, a first communication chip 1407 may be dedicated to shorter-range wireless communications such as Wi-Fi or Bluetooth, and a second communication chip 1407 may be dedicated to longer-range wireless communications such as GPS, EDGE, GPRS, CDMA, WiMAX, LTE, EV-DO, or others. In some embodiments, a first communication chip 1407 may be dedicated to wireless communications, and a second communication chip 1407 may be dedicated to wired communications.

Computing device 1400 may include battery/power circuitry 1408. Battery/power circuitry 1408 may include one or more energy storage devices (e.g., batteries or capacitors) and/or circuitry for coupling components of computing device 1400 to an energy source separate from computing device 1400 (e.g., AC line power).

Computing device 1400 may include a display device 1403 (or corresponding interface circuitry, as discussed above). Display device 1403 may include any visual indicators, such as a heads-up display, a computer monitor, a projector, a touchscreen display, a liquid crystal display (LCD), a light-emitting diode display, or a flat panel display, for example.

Computing device 1400 may include an audio output device 1404 (or corresponding interface circuitry, as discussed above). Audio output device 1404 may include any device that generates an audible indicator, such as speakers, headsets, or earbuds, for example.

Computing device 1400 may include an audio input device 1410 (or corresponding interface circuitry, as discussed above). Audio input device 1410 may include any device that generates a signal representative of a sound, such as microphones, microphone arrays, or digital instruments (e.g., instruments having a musical instrument digital interface (MIDI) output).

Computing device 1400 may include a global positioning system (GPS) device 1409 (or corresponding interface circuitry, as discussed above). GPS device 1409 may be in communication with a satellite-based system and may receive a location of computing device 1400, as known in the art.

Computing device 1400 may include other output device 1405 (or corresponding interface circuitry, as discussed above). Examples of the other output device 1405 may include an audio codec, a video codec, a printer, a wired or wireless transmitter for providing information to other devices, or an additional storage device.

Computing device 1400 may include other input device 1411 (or corresponding interface circuitry, as discussed above). Examples of the other input device 1411 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1400 may include a security interface device 1412. Security interface device 1412 may include any device that provides security measures for computing device 1400 such as intrusion detection, biometric validation, security encode or decode, access list management, malware detection, or spyware detection, Computing device 1400, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following embodiments pertain to further embodiments.

In one or more first embodiments, an integrated circuit structure comprises a channel material spanning a length between a source and a drain, and a plurality of gate structures spaced across the length of the channel material between the source and the drain, wherein adjacent ones of the gate structures are separated by dielectric material, and wherein each of the gate structures is coupled to a separate control line.

In one or more second embodiments, further to the first embodiments, a first of the gate structures has a first length along the channel material and a second of the gate structures has a second length along the channel material of not more than half the first length.

In one or more third embodiments, further to the first or second embodiments, the first length is one of about four times the second length or about eight times the second length.

In one or more fourth embodiments, further to the first through third embodiments, the channel material comprises a semiconductor material having a band gap of not more than 0.8 eV.

In one or more fifth embodiments, further to the first through fourth embodiments, the channel material is a crystalline material comprising one of indium and arsenic, indium and antimony, gallium and antimony, or indium, gallium, and arsenic.

In one or more sixth embodiments, further to the first through fifth embodiments, the channel material further comprises one of oxygen, sulfur, or selenium.

In one or more seventh embodiments, further to the first through sixth embodiments, the channel material is a crystalline material comprising one of germanium or silicon and germanium with not less than 75% germanium.

In one or more eighth embodiments, further to the first through seventh embodiments, the channel structure is a crystalline material comprising one of SiGe, Ge, InAs, InP, IGZO, InGaAs, $MoS_2$, or $WSe_2$ doped with a dopant material comprising one of Al, B, oxygen vacancies, or hydrogen at a concentration between 1e16/cm3 to 1e22/cm3.

In one or more ninth embodiments, further to the first through eighth embodiments, the integrated circuit structure further comprises a gate dielectric material between the gate structures and the channel material.

In one or more tenth embodiments, a system comprises an integrated circuit (IC) die comprising an analog to digital converter (DAC), the DAC comprising a channel material spanning a length between a source and a drain, and a plurality of gate structures coupled to the channel material, the gate structures spaced apart with adjacent ones of the gate structures are separated by dielectric material, wherein each of the gate structures is coupled to a separate control line of a metallization layer of the IC die, and a cooling structure operable to remove heat from the IC die to achieve an operating temperature at or below −25° C.

In one or more eleventh embodiments, further to the tenth embodiments, a first of the gate structures has a first length along the channel material and a second of the gate structures has a second length along the channel material of not more than half the first length.

In one or more twelfth embodiments, further to the tenth or eleventh embodiments, the channel material is a crystalline material comprising one of indium and arsenic, indium and antimony, gallium and antimony, or indium, gallium, and arsenic.

In one or more thirteenth embodiments, further to the tenth through twelfth embodiments, the channel material is a crystalline material comprising one of germanium or silicon and germanium with not less than 75% germanium.

In one or more fourteenth embodiments, further to the tenth through thirteenth embodiments, the channel structure is a crystalline material comprising one of SiGe, Ge, InAs, InP, IGZO, InGaAs, $MoS_2$, or $WSe_2$ doped with a dopant material comprising one of Al, B, oxygen vacancies, or hydrogen at a concentration between 1e16/cm3 to 1e22/cm3.

In one or more fifteenth embodiments, further to the tenth through fourteenth embodiments, the cooling structure comprises a plurality of microchannels in the IC die and over the plurality of metallization layers, the microchannels to convey a heat transfer fluid therein.

In one or more sixteenth embodiments, further to the tenth through fifteenth embodiments, the cooling structure one of a solid body comprising microchannels to convey a heat transfer fluid therein or a heat sink for immersion in a low-boiling point liquid.

In one or more seventeenth embodiments, further to the tenth through sixteenth embodiments, the IC die further comprises a transistor co-planar with the DAC, and wherein a drain of the transistor is coupled to a first gate structure of the plurality of gate structure.

In one or more eighteenth embodiments, a method comprises forming a digital to analog converter structure over a substrate, the digital to analog converter structure comprising a channel material spanning a length between a source and a drain and a plurality of gate structures spaced across the length of the channel material between the source and the drain, and forming a plurality of metallization layers over the transistor, wherein each of the gate structures is coupled to a separate control line of the metallization layers.

In one or more nineteenth embodiments, further to the eighteenth embodiments, the method further comprises providing a cooling structure operable to remove heat from the digital to analog converter structure to achieve an operating temperature at or below −25° C.

In one or more twentieth embodiments, further to the eighteenth or eighteenth embodiments, a first of the gate structures has a first length along the channel material and a second of the gate structures has a second length along the channel material of not more than half the first length.

In one or more twenty-first embodiments, further to the eighteenth through twentieth embodiments, the channel material is a crystalline material comprising one of indium and arsenic, indium and antimony, gallium and antimony, or indium, gallium, and arsenic.

In one or more twenty-second embodiments, further to the eighteenth through twenty-first embodiments, the channel structure is a crystalline material comprising one of SiGe, Ge, InAs, InP, IGZO, InGaAs, $MoS_2$, or $WSe_2$ doped with a dopant material comprising one of Al, B, oxygen vacancies, or hydrogen at a concentration between 1e16/cm3 to 1e22/cm3.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit structure, comprising:
a channel material spanning a length between a source and a drain; and
a plurality of gate structures spaced across the length of the channel material between the source and the drain, wherein adjacent ones of the gate structures are separated by dielectric material, and wherein each of the gate structures is coupled to a separate control line.

2. The integrated circuit structure of claim 1, wherein a first of the gate structures has a first length along the channel material and a second of the gate structures has a second length along the channel material of not more than half the first length.

3. The integrated circuit structure of claim 2, wherein the first length is one of about four times the second length or about eight times the second length.

4. The integrated circuit structure of claim 1, wherein the channel material comprises a semiconductor material having a band gap of not more than 0.8 eV.

5. The integrated circuit structure of claim 1, wherein the channel material is a crystalline material comprising one of indium and arsenic, indium and antimony, gallium and antimony, or indium, gallium, and arsenic.

6. The integrated circuit structure of claim 5, wherein the channel material further comprises one of oxygen, sulfur, or selenium.

7. The integrated circuit structure of claim 1, wherein the channel material is a crystalline material comprising one of germanium or silicon and germanium with not less than 75% germanium.

8. The integrated circuit structure of claim 1, wherein the channel material is a crystalline material comprising one of SiGe, Ge, InAs, InP, IGZO, InGaAs, $MoS_2$, or $WSe_2$ doped with a dopant material comprising one of Al, B, oxygen vacancies, or hydrogen at a concentration between 1e16/cm3 to 1e22/cm3.

9. The integrated circuit structure of claim 1, further comprising:

a gate dielectric material between the gate structures and the channel material.

10. A system, comprising:

an integrated circuit (IC) die comprising an a digital to analog converter (DAC), the DAC comprising:

a channel material spanning a length between a source and a drain; and a plurality of gate structures coupled to the channel material, the gate structures spaced apart with adjacent ones of the gate structures are separated by dielectric material, wherein each of the gate structures is coupled to a separate control line of a metallization layer of the IC die; and a cooling structure operable to remove heat from the IC die to achieve an operating temperature at or below −25° C.

11. The system of claim 10, wherein a first of the gate structures has a first length along the channel material and a second of the gate structures has a second length along the channel material of not more than half the first length.

12. The system of claim 10, wherein the channel material is a crystalline material comprising one of indium and arsenic, indium and antimony, gallium and antimony, or indium, gallium, and arsenic.

13. The system of claim 10, wherein the channel material is a crystalline material comprising one of germanium or silicon and germanium with not less than 75% germanium.

14. The system of claim 10, wherein the channel material is a crystalline material comprising one of SiGe, Ge, InAs, InP, IGZO, InGaAs, $MoS_2$, or $WSe_2$ doped with a dopant material comprising one of Al, B, oxygen vacancies, or hydrogen at a concentration between 1e16/cm3 to 1e22/cm3.

15. The system of claim 10, wherein the cooling structure comprises a plurality of microchannels in the IC die and over the metallization layer, the microchannels to convey a heat transfer fluid therein.

16. The system of claim 10, wherein the cooling structure one of a solid body comprising microchannels to convey a heat transfer fluid therein or a heat sink for immersion in a low-boiling point liquid.

17. The system of claim 10, wherein the IC die further comprises a transistor co-planar with the DAC, and wherein a drain of the transistor is coupled to a first gate structure of the plurality of gate structures.

18. A method, comprising:

forming a digital to analog converter structure over a substrate, the digital to analog converter structure comprising:

a channel material spanning a length between a source and a drain; and a plurality of gate structures spaced across the length of the channel material between the source and the drain; and forming a plurality of metallization layers over the digital to analog converter structure, wherein each of the gate structures is coupled to a separate control line of the metallization layers.

19. The method of claim 18, further comprising:

providing a cooling structure operable to remove heat from the digital to analog converter structure to achieve an operating temperature at or below −25° C.

20. The method of claim 18, wherein a first of the gate structures has a first length along the channel material and a second of the gate structures has a second length along the channel material of not more than half the first length.

21. The method of claim 18, wherein the channel material is a crystalline material comprising one of indium and arsenic, indium and antimony, gallium and antimony, or indium, gallium, and arsenic.

22. The method of claim 18, wherein the channel material is a crystalline material comprising one of SiGe, Ge, InAs, InP, IGZO, InGaAs, $MoS_2$, or $WSe_2$ doped with a dopant material comprising one of Al, B, oxygen vacancies, or hydrogen at a concentration between 1e16/cm3 to 1e22/cm3.

* * * * *